United States Patent [19]

Kittler, Jr. et al.

[11] Patent Number: 5,011,569
[45] Date of Patent: * Apr. 30, 1991

[54] THIN FILM ARTWORK COMPOUNDS

[75] Inventors: Wilfred C. Kittler, Jr., Thousand Oaks; Janos Czukor, Panorama City; Darrell Stoddard, Malibu, all of Calif.

[73] Assignee: Andus Corporation, Canoga Park, Calif.

[*] Notice: The portion of the term of this patent subsequent to Mar. 27, 2007 has been disclaimed.

[21] Appl. No.: 469,879

[22] Filed: Jan. 24, 1990

Related U.S. Application Data

[63] Continuation of Ser. No. 10,873, Feb. 4, 1987, Pat. No. 4,911,785.

[51] Int. Cl.$^5$ .............................. C23F 1/00; B44C 1/22
[52] U.S. Cl. .................................... 156/656; 156/666; 156/667; 252/79.1; 252/79.5
[58] Field of Search ..................... 156/659.1, 667, 635, 156/628, 656, 666; 204/192.15, 192.16, 192.26, 192.29; 252/79.1, 79.5

[56] References Cited

U.S. PATENT DOCUMENTS

| 2,825,687 | 3/1958 | Silvey et al. |
| 3,705,061 | 12/1972 | King |
| 3,822,155 | 7/1974 | Feldstein et al. |
| 3,919,100 | 11/1975 | Brindisi, Jr. et al. |
| 3,942,981 | 3/1976 | Sato |
| 4,123,309 | 10/1978 | Perrington et al. |
| 4,319,955 | 3/1982 | Murski |
| 4,336,119 | 6/1982 | Gillery |
| 4,379,040 | 4/1983 | Gillery |
| 4,469,777 | 9/1984 | O'Neil |
| 4,636,282 | 1/1987 | Wong |
| 4,640,739 | 2/1987 | Modic et al. |
| 4,652,336 | 3/1987 | Andrascek et al. |
| 4,673,521 | 6/1987 | Sullivan et al. |
| 4,911,785 | 3/1990 | Kittler, Jr. et al. ................. 156/656 |

FOREIGN PATENT DOCUMENTS

| 0057528 | 8/1982 | European Pat. Off. |
| 0946588 | 8/1956 | Fed. Rep. of Germany |
| 2246891 | 5/1975 | France |

OTHER PUBLICATIONS

Feldstein et al., J. Electrochem. Soc., vol. 120, No. 12, pp. 1654–1657 (1973).
World Patent Index WPI 75-46589W/28.
Pat. Abst. Japan, vol. 9, No. 308 (P-410) [2031], (Dec. 4, 1985), (abstract of JP No. 60-140236(a)).

Primary Examiner—David A. Simmons
Assistant Examiner—Thi Dang
Attorney, Agent, or Firm—Herbert G. Burkard; Yuan Chao

[57] ABSTRACT

A graphic artwork includes a thin film coating layer thereon which includes a copper oxide which is substantially opaque to ultraviolet light and partially transmissive to visible light and suitable for printing circuiting on a printed circuit board or for other graphic artwork. In the case where the thin film compound includes unoxidized copper, etching thereof to achieve a predetermined pattern on the graphic artwork is facilitated by using a mixture of ammonium chloride and hydrogen peroxide.

5 Claims, 4 Drawing Sheets

FIG_1
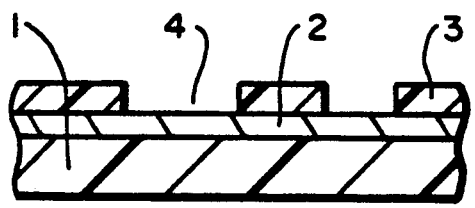
FIG_2
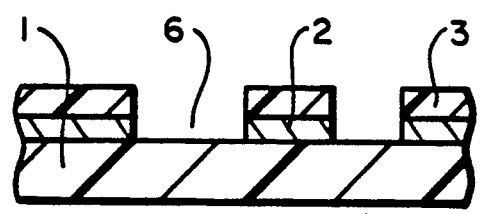
FIG_3
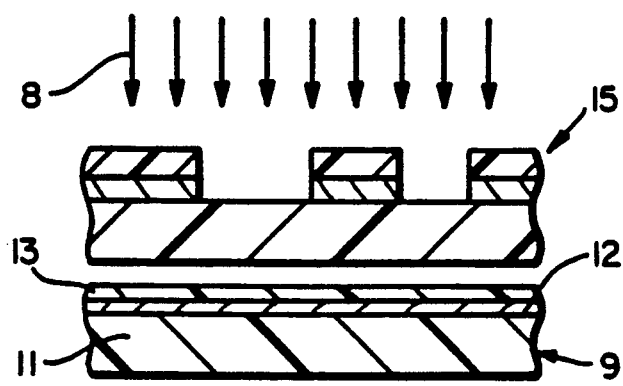
FIG_4

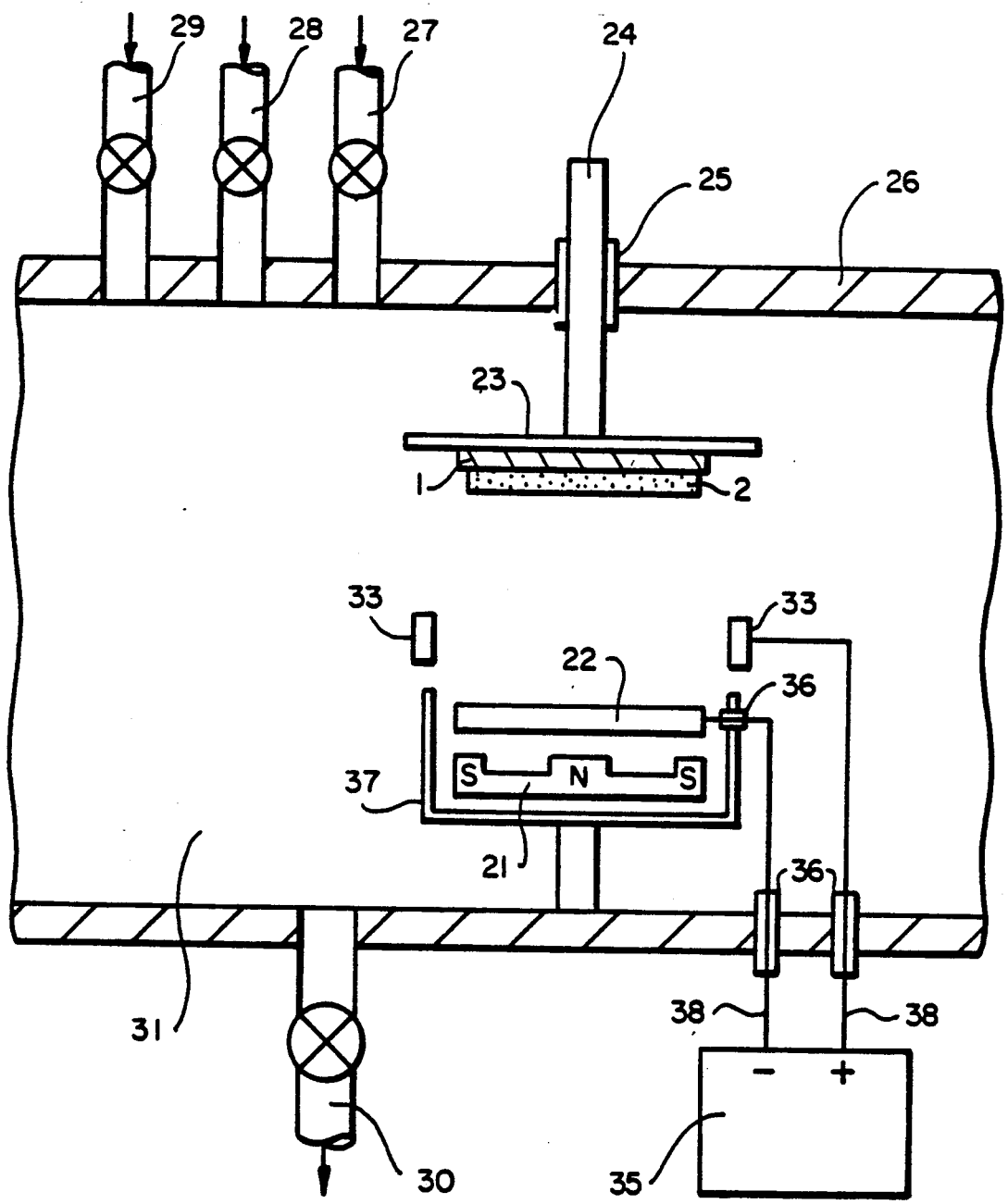
FIG_5

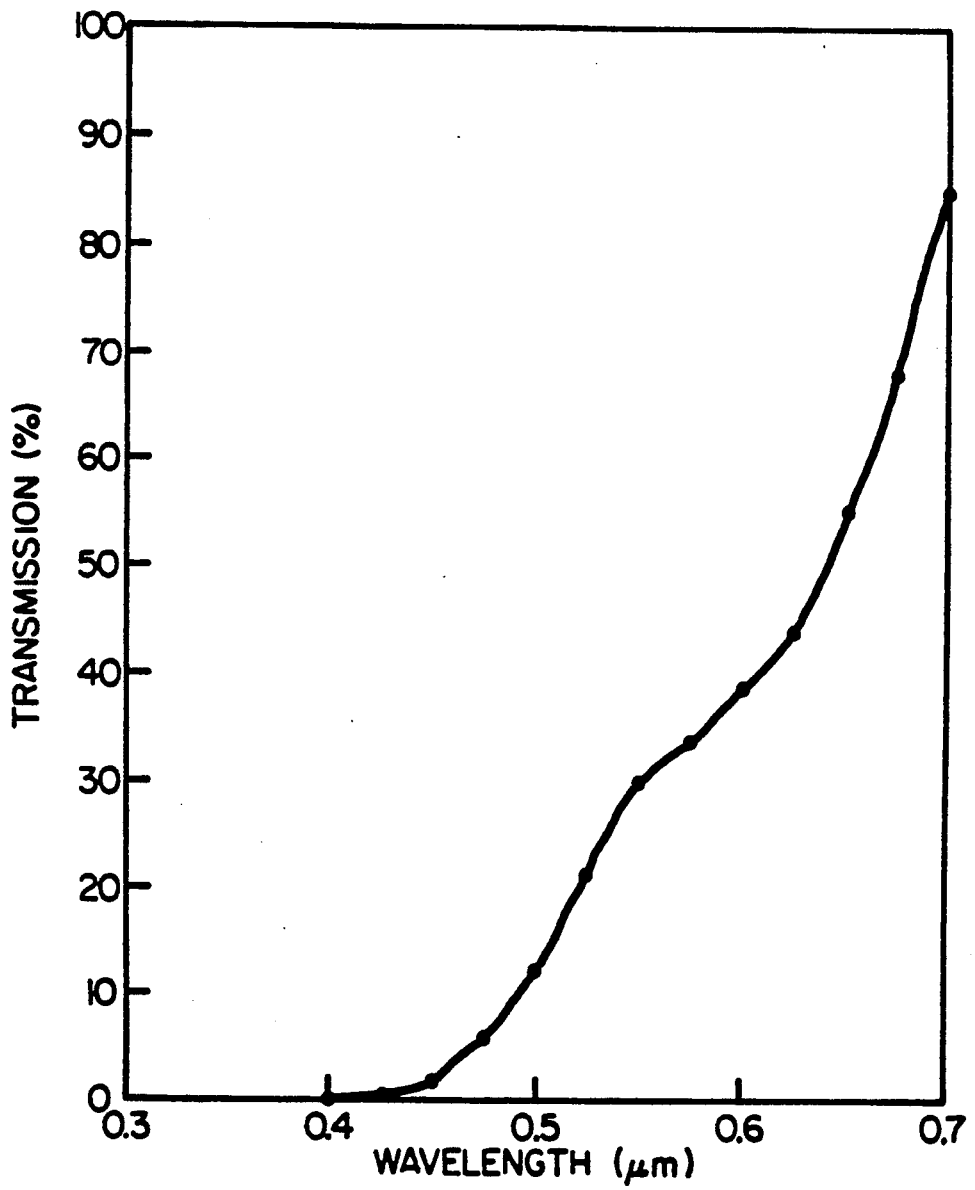
FIG_6

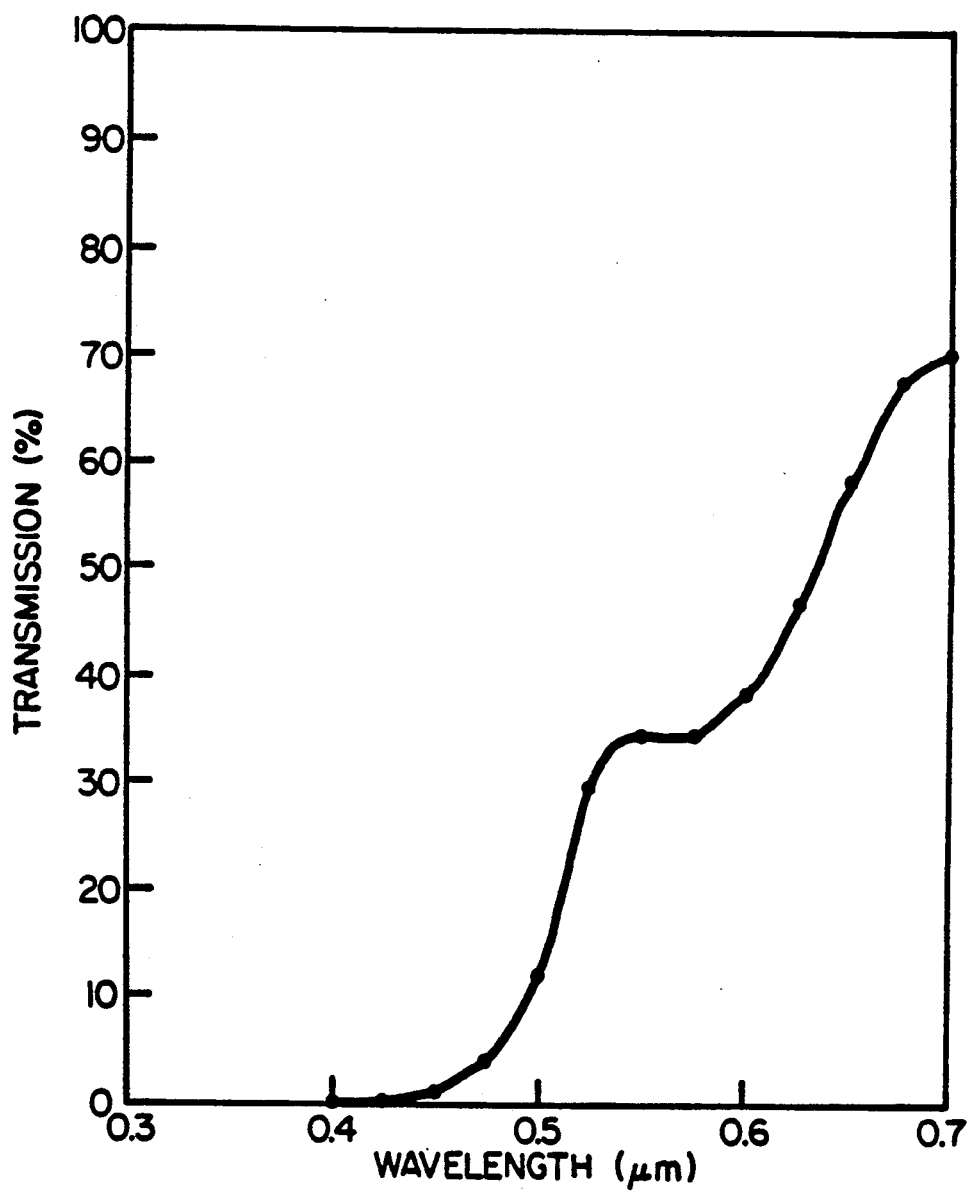
FIG_7

THIN FILM ARTWORK COMPOUNDS

CROSS REFERENCE TO RELATED APPLICATIONS

This application is a continuation of application No. 07/010,873, filed Feb. 4, 1987, now U.S. Pat. No. 4,911,785.

BACKGROUND OF THE INVENTION

The present invention relates to thin film compounds or coating layers which are opaque to ultraviolet light radiation, methods of etching such coating layers or compounds to produce masking patterns, resultant graphic artworks created thereby, and patterned products produced using such graphic artworks.

Heretofore, thin film coatings for producing graphic artworks such as masks for printed circuits or photo tools for graphic printing have suffered from a variety of known disadvantages. For example, germanium is a well known compound which is opaque to ultraviolet light and hence useful for producing patterned graphic artworks, but has an inherent disadvantage due to its high cost. Metals such as zinc or aluminum could be used for the production of graphic artworks since they are also opaque to ultraviolet light, but an accompanying disadvantage is that rather strong caustic solutions are required to appropriately etch these metals. Zinc has an additional disadvantage in that it is soft. Also, metals are not transparent at visible light wavelengths and hence it is difficult to align a mask or graphic artwork using metals if the product being masked requires several superimposed pattern layers.

SUMMARY OF THE INVENTION

It is an object of the present invention to eliminate the above-noted drawbacks and to provide a coating layer for a graphic artwork which is easy to deposit, is relatively inexpensive, is easy to etch, and does not require the use of rather strong caustic solutions during etching.

These and other objects of the invention are achieved by a substrate including a coating layer which includes copper oxide, the coating layer consisting essentially of the copper oxide $Cu_2O$ according to one embodiment, and consisting essentially of a copper oxide plus unoxidized copper atoms according to another embodiment, the coating layer being deposited on a substrate as a thin film having a thickness less than 3000 angstroms for example, a patterned resist material being disposed over the coating layer so as to form a predetermined pattern on the coating layer, exposed portions of the coating layer thereafter being etched.

According to an additional preferred embodiment of the invention, the coating layer is etched using ammonium chloride when the coating layer consists essentially of copper oxide, and for the embodiment where the coating layer consists essentially of a copper oxide plus unoxidized copper atoms, ammonium chloride mixed with hydrogen peroxide is used for etching, the hydrogen peroxide oxidizing any non-oxidized copper atoms or molecules.

According to a preferred embodiment, the coating layer is deposited by planar magnetron reactive sputtering whereby a target being sputtered comprising essentially pure copper metal, with oxygen being introduced into the sputtering chamber as a gas. Optimum optical properties of the coating layer are determined by varying a sputtering power and an oxygen partial pressure within the sputtering chamber while measuring the resultant optical properties of the coating layers so produced using feedback control. Specifically, the coating layer can be tailored so as to have a transmission to light having a wavelength between 300 and 400 nanometers which is less than 10%, preferably less than 1%, more preferably less than 0.1%, and optimally less than 0.01%. Also, the coating layer can be tailored so as to have a transmission to visible light, e.g. light having a wavelength between 600 and 700 nanometers, which is greater than 20%, preferably greater than 40%, optimally greater than 60%.

BRIEF DESCRIPTION OF THE DRAWINGS

FIG. 1 illustrates a substrate having a coating layer of the invention disposed thereon;

FIG. 2 illustrates the embodiment of FIG. 1 on which has been disposed a patterned resist material;

FIG. 3 illustrates the embodiment of FIG. 2 after etching;

FIG. 4 illustrates a mask as illustrated in FIG. 3 being used for producing a predetermined pattern on a printed circuit board;

FIG. 5 illustrates a process for depositing the coating of the invention on a substrate;

FIG. 6 is a graph illustrating transmission characteristics as a function of light wavelength for a coating of the invention produced according to Example 1; and FIG. 7 illustrates transmission characteristics of a coating as a function of light wavelength for a coating produced according to Example 2.

DESCRIPTION OF THE PREFERRED EMBODIMENTS

FIGS. 1-4 generally illustrate a process for making a graphic artwork of the invention.

FIG. 1 illustrates a substrate 1 on which has been formed a coating layer 2, and FIG. 2 illustrates the article of FIG. 1 subsequent to a resist material 3 being formed on top of the coating layer 2 in a predetermined pattern. Thereafter, the substrate 1, the coating layer 2, and the pattern resist material 3 are exposed to an etching solution which selectively etches exposed portions 4 of the coating 2 rather than the resist material 3 so as to form the predetermined pattern on the substrate 1 and also on the coating layer 2, as illustrated in FIG. 3. The graphic artwork 15 so produced is then used to transfer the predetermined pattern onto an appropriate medium, such as a printed circuit board 9 illustrated in FIG. 4 so as to print circuit paths and circuit features corresponding to the predetermined pattern onto conducting layer 12 of the board 9.

The printing is accomplished by disposing the graphic artwork or mask 15 over the printed circuit board 9 and exposing both the graphic artwork 15 and the printed circuit board 9 to ultraviolet light radiation 8. The radiation is transmitted through the graphic artwork 15 at all areas thereof where the coating layer 2 has previously been etched away thereby exposing an upper ultraviolet sensitive layer 13 of the printed circuit board along these areas, the ultraviolet light radiation being blocked by the graphic artwork at all locations where the coating layer 2 has not been previously removed. After ultraviolet light radiation exposure, exposed portions of the ultraviolet sensitive layer 13 of the printed circuit board 9 are removed by conventional techniques, and portions of the metal layer 12 so exposed are then etched away so as to form the predetermined pattern within the metal layer 12 of the printed circuit board.

In practice, it is not atypical for a printed circuit board to have a plurality of stacked metal layers thereon each individually patterned in a preselected way, the plurality of layers being interconnected by vias or vertical circuit lines. Accordingly, it can be appreciated that for producing such multilayer printed circuit boards it is advantageous that the graphic artworks or masks used for printing the circuits on the various board layers be at least partially transparent at visual light wavelengths so as to assist in aligning the masks with alignment markings on the board or other patterns of a set of masks.

Of course the graphic artworks of the invention can be used in additional applications as well. For example, masks are used for producing color printing plates. Since a plurality of such masks and associated plates need to be used to superimpose a plurality of colors for a single image to achieve good color resolution, it is particularly advantageous that the masks used to create these plates be semitransparent at visual wavelengths so as to allow the masks associated with any one image to be stacked to insure a partial image of each mask appropriately registers with partial images of each of the other masks.

According to a first embodiment of the invention, the coating layer 2 of the graphic artwork 15 comprises a copper oxide thin film, optimally having a thickness of between 300 and 3000 angstroms, preferably between 500 and 2000 angstroms, e.g. between 600 and 1200 angstroms, the copper oxide essentially corresponding to $Cu_2O$. Though the oxide $Cu_2O$ is known to be formed according to the first embodiment since a color of the coating is yellowish, it is conceivable that the other oxide of copper, CuO, may also exist in small amounts in the coating layer of the first embodiment.

According to a second embodiment of the invention, the coating layer 2 comprises a copper oxide plus unoxidized copper metal particles, the coating layer having a volume average composition $Cu_2O_x$ where x is less than 2.0, preferably less than 1.0.

It should be noted there are a variety of ways of characterizing the crystalline structure of the coating layer of the second embodiment of the invention, e.g., as a suboxide or as a cermet, due to its extremely thin layer structure and an inevitable random nature in which it must be deposited. However, the characterization of the coating layer as only one of a suboxide and a cermet is actually of only academic concern, the important characteristic of the coating being that unoxidized copper does exist, and hence the volume average composition of the coating layer comprises $CuO_x$ where x is less than 1.0, and preferably less than 0.5.

Preferred materials for the substrate include polyester and other types of thin plastic films. Examples of resist materials include Riston ® manufactured by DuPont and AZ1350 liquid photoresist manufactured by Shipley.

A preferred method for forming the coating layer 2 on the substrate 1 is by planar magnetron reactive sputtering using an apparatus such as that illustrated in FIG. 6. Referring more particularly to FIG. 6, a target 2, which comprises a cathode, consists essentially of copper metal, and is located directly above a magnet 21 utilized for confining ionized gases in a region of the target 22, the gases to be ionized being injected into a sputtering chamber 31 via any one of inlet ports 27–29.

An outlet port 30 is provided for evacuating the sputtering chamber 31. The copper is deposited onto the substrate 1 as the layer 2 by maintaining a voltage differential between the cathode copper target 22 and an anode 33 while introducing at least one inert gas such as argon into the sputtering chamber which is ionized by electric fields created within the sputtering chamber 1. The ionized gas causes metal particles to be knocked off the target 22 and to be sputter deposited onto the substrate 1. FIG. 1 further shows a substrate holder 23, 24, a seal 25 for sealing between the holder portion 24 and a wall 26 of the sputtering chamber 31, a D.C. high voltage power source 35, insulation 36, a shielding box 37 disposed around the copper cathode target 22, and electrical connection cables 38 connected to the power source 35.

An important embodiment of the invention is that oxygen is introduced into the sputtering chamber 31 via any one of the inlet ports 27–29 so that the copper metal particles are deposited onto the substrate as an oxide or suboxide, depending upon the partial pressure of oxygen within the sputtering chamber 31 and the sputtering power. Accordingly, if the substrate 1 is continuously transported across a sputtering region within the sputtering chamber 31 while a partial pressure of oxygen within the sputtering chamber 31 and/or a sputtering power is varied, it is possible to deposit various different coating layer compositions onto the substrate 1 so as to obtain optimum optical properties. In addition, if the opaqueness or transparency of the coated substrate 1 is measured soon after sputtering at various light wavelengths, feedback control can also be incorporated so as to continuously vary various deposition parameters until an optimum coating layer composition is achieved.

For example, for some masking operations, a pure copper oxide composition, $Cu_2O$, may be found desirous since such a coating layer is essentially opaque to ultraviolet light having a wavelength from approximately 300 nanometers to 400 nanometers, and yet such a coating layer is also partially transparent at visible light wavelengths and in fact appears visually as yellowish. Such a coating layer is extremely advantageous where at least partial visual light transparency is required for a graphic artwork such as for example where registration at a particular location on a printed circuit board or other article to be produced is required. On the other hand, in some applications a coating layer further including unoxidized copper oxide is more desirous since the resultant coating layer is even more opaque to ultraviolet light radiation, though in general a copper oxide including nonoxidized copper is also more opaque at visual light wavelengths hence making registering difficult if necessary.

The copper oxide and copper oxide including nonoxidized copper of the invention have several significant advantages over prior art coating layers used for masks and other types of graphic artworks. First, these coating layers are extremely environmentally stable, second they are easily produced and optimized using reactive magnetron sputtering techniques, and third it is possible to etch such coating layers with materials that are noncaustic and relatively environmentally benign. In addition, the coating layers of the invention can be produced as extremely thin layers, as mentioned typically between 300 and 3000 angstroms thick, preferably between 500 and 1500 angstroms thick, optimally between 600 and 1200 angstroms thick, and are very fine grained, so that they can be etched to form extremely fine line patterns. And, as mentioned, optical properties of these coating layers can be readily adapted to meet optimum requirements for any particular photo reproductive system.

The invention further includes a novel method for etching coating layers of the invention, these coating layers being etched by using a solution of ammonium chloride and hydrogen peroxide. For a fully oxidized coating layer, ammonium chloride is sufficient to etch the coating layer completely. However, when the coating layer also comprises unoxidized copper, ammonium chloride is not capable of etching the unoxidized copper metal particles, and accordingly the use of hydrogen peroxide in conjunction with the ammonium chloride results in the copper being fully oxidizible and hence fully removable in the solution.

The invention will be further described with reference to particular examples.

EXAMPLE 1

An eighteen inch diameter stainless steel bell jar vacuum chamber was fitted with a planar magnetron sputtering source with an 8"×3" target surface and a 12" diameter rotating drum substrate holder around which a substrate of flexible film would be wrapped. The target to substrate separation was 2½.

The planar magnetron source was filled with a 99.9% pure copper target, and a substrate of 4 mil thick PET polyester film substrate was wrapped around the drum.

The chamber was evacuated to a pressure of $1.8 \times 10^{-5}$ Torr, then the following coating conditions were met: partial pressure of argon gas, 2.0 mTorr; partial pressure of oxygen gas, 0.30 mTorr; sputtering power, 500 watts; drum speed, 0.19 rpm; coating time, 25 sec.

The resulting coating had a composition consisting essentially of $Cu_2O$, a visible light transmission of 60%, a yellow color, and a transmission spectrum as shown in FIG. 7. It was less than 1% transparent to ultraviolet radiation of wavelengths less than 400 mm.

This coating could be completely removed by immersing it for 20 sec. in a solution of 27% (by weight) of ammonium chloride in water at 20 degrees for 20 seconds.

The coating was however quite stable, and showed no change in properties after extended periods in air, at 80 degrees dry heat, and at 60 degrees C., 95% RH environments.

EXAMPLE 2

The apparatus used in Example 1 was used to coat a piece of 4 mil thick PET polyester film in the same manner as was used in Example 1, using the following conditions.

The chamber was evacuated to a pressure of $1.8 \times 10^{-5}$ Torr, then backfilled with argon gas to a partial pressure of 2.0 mTorr and oxygen gas to a partial pressure of 0.8 mTorr. The target was then sputtered in this atmosphere at a power of 1000 watts for twelve minutes, while the substrate drum was rotated at a speed of 0.5 rpm.

The resulting coating had a composition $CuO_x$ where x was less than 0.5, had an optical density of 2.67 for visible light, and a transmission spectrum as shown in FIG. 2. It was less than 0.1% transparent to ultraviolet radiation of wavelengths less than 400 mm.

This coating could be completely removed by immersing it for 20 seconds in a solution of 27% ammonium chloride in water plus 7 ml of 3% hydrogen peroxide solution per 100 ml of ammonium chloride solution, at 20 degrees C.

The coating was however quite stable, and showed no change in properties after extended periods in air, 80 degrees C. dry heat and 60 degrees C. 95% RH, environments.

What is claimed is:

1. A method of etching a thin film comprising oxidized and nonoxidized copper, comprising the steps of:
   providing a thin film comprising copper oxide and nonoxidized copper metal;
   disposing a mixture which comprises ammonium chloride and hydrogen peroxide on selected areas of the film to be etched so as to form a predetermined pattern thereon.
2. The method of claim 1, the film having a thickness prior to etching of between 300 and 3000 angstroms.
3. The method of claim 1, the film having a thickness prior to etching of between 500 and 1500 angstroms.
4. The method of claim 1, the film having a thickness prior to etching of between 600 and 1200 angstroms.
5. The method of claim 1, the mixture consisting essentially of ammonium chloride and hydrogen peroxide.

* * * * *